(12) United States Patent
Kwon et al.

(10) Patent No.: US 8,802,997 B2
(45) Date of Patent: Aug. 12, 2014

(54) MULTI LAYER CIRCUIT BOARD AND MANUFACTURING METHOD OF THE SAME

(75) Inventors: Jeong Don Kwon, Daejeon (KR); Seung Min Hong, Gyeonggi-do (KR); Ju Ho Shin, Chungcheongbuk-do (KR)

(73) Assignee: Doosan Corporation (KR)

( * ) Notice: Subject to any disclaimer, the term of this patent is extended or adjusted under 35 U.S.C. 154(b) by 553 days.

(21) Appl. No.: 13/063,631

(22) PCT Filed: Dec. 18, 2008

(86) PCT No.: PCT/KR2008/007509
§ 371 (c)(1),
(2), (4) Date: May 31, 2011

(87) PCT Pub. No.: WO2010/030059
PCT Pub. Date: Mar. 18, 2010

(65) Prior Publication Data
US 2011/0214907 A1 Sep. 8, 2011

(30) Foreign Application Priority Data
Sep. 11, 2008 (KR) .................. 10-2008-0089647

(51) Int. Cl.
*H05K 1/03* (2006.01)

(52) U.S. Cl.
USPC ........... 174/256; 174/255; 174/259; 428/156; 428/209; 442/234; 257/700; 257/678; 257/774; 257/778; 501/35

(58) Field of Classification Search
USPC .......... 174/256, 255, 259; 428/156, 209; 442/234; 257/700, 678, 774, 778; 501/35
See application file for complete search history.

(56) References Cited

U.S. PATENT DOCUMENTS

| | | | | | |
|---|---|---|---|---|---|
| 3,697,668 | A | * | 10/1972 | Campbell | 327/525 |
| 4,803,115 | A | * | 2/1989 | Fushiki et al. | 442/234 |
| 4,883,708 | A | * | 11/1989 | Kariya et al. | 442/198 |
| 5,047,279 | A | * | 9/1991 | Nasu et al. | 428/156 |
| 5,407,872 | A | * | 4/1995 | Komori et al. | 501/35 |

(Continued)

FOREIGN PATENT DOCUMENTS

| | | |
|---|---|---|
| JP | 2003-69221 A | 3/2003 |
| JP | 2005-150424 A | 6/2005 |

(Continued)

OTHER PUBLICATIONS

International Search Report for International Application No. PCT/KR2008/007509 dated Jul. 27, 2009.

*Primary Examiner* — Xiaoliang Chen
(74) *Attorney, Agent, or Firm* — Cantor Colburn LLP

(57) ABSTRACT

Disclosed is a PCB having multiple layers of heavy copper. A prepreg having a nonwoven glass web substrate is used alone or together with another prepreg having a glass fabric substrate so that the space between heavy copper, which is comparable to a thick film, can be filled efficiently without creating voids. The PCB includes a copper clad laminate having first copper patterned on one surface or both surfaces of a core substrate; at least one first prepreg laminated on one surface or both surfaces of the copper clad laminate, nonwoven glass web being used as the substrate of the first prepreg; at least one second prepreg laminated on one surface or both surfaces of the first prepreg, glass fabric being used as a substrate of the second prepreg; and second copper laminated on one surface or both surfaces of the second prepreg.

5 Claims, 9 Drawing Sheets

(56) References Cited

U.S. PATENT DOCUMENTS

| | | | |
|---|---|---|---|
| 5,948,543 A * | 9/1999 | Ootuka et al. | 428/474.4 |
| 6,040,252 A * | 3/2000 | Ootuka et al. | 442/169 |
| 6,096,411 A * | 8/2000 | Nakatani et al. | 428/209 |
| 6,121,553 A * | 9/2000 | Shinada et al. | 174/259 |
| 6,263,158 B1 * | 7/2001 | Rutherford | 392/503 |
| 6,291,064 B1 * | 9/2001 | Kadowaki et al. | 428/332 |
| 6,376,049 B1 * | 4/2002 | Asai et al. | 428/209 |
| 6,376,052 B1 * | 4/2002 | Asai et al. | 428/209 |
| 6,415,104 B1 * | 7/2002 | Fitts et al. | 392/503 |
| 6,433,317 B1 * | 8/2002 | Arx et al. | 219/468.1 |
| 6,489,012 B1 * | 12/2002 | Yang et al. | 428/209 |
| 6,748,646 B2 * | 6/2004 | Von Arx et al. | 29/613 |
| 6,849,934 B2 * | 2/2005 | Ogawa et al. | 257/678 |
| 2002/0187321 A1 * | 12/2002 | Hirano et al. | 428/209 |
| 2003/0094232 A1 * | 5/2003 | Saitou et al. | 156/181 |
| 2003/0230813 A1 * | 12/2003 | Hirano et al. | 257/774 |
| 2005/0159516 A1 * | 7/2005 | Kwon et al. | 524/96 |
| 2006/0012028 A1 * | 1/2006 | Usui et al. | 257/700 |
| 2006/0028305 A1 | 2/2006 | Dutta et al. | |
| 2006/0193970 A1 * | 8/2006 | Myung et al. | 427/96.1 |
| 2007/0287021 A1 * | 12/2007 | Takeuchi et al. | 428/623 |
| 2008/0097014 A1 * | 4/2008 | Park et al. | 524/110 |
| 2008/0302558 A1 * | 12/2008 | Takeuchi et al. | 174/250 |
| 2009/0008136 A1 * | 1/2009 | Ikeguchi et al. | 174/255 |
| 2009/0026604 A1 * | 1/2009 | Shin et al. | 257/702 |
| 2009/0151984 A1 * | 6/2009 | Fujimura | 174/250 |
| 2009/0152742 A1 * | 6/2009 | Ikeguchi et al. | 257/778 |
| 2010/0316878 A1 * | 12/2010 | Naritomi et al. | 428/461 |

FOREIGN PATENT DOCUMENTS

| | | |
|---|---|---|
| KR | 2002-0012617 A | 2/2002 |
| KR | 10-2004-0111302 A | 12/2004 |
| KR | 10-2005-0112365 A | 11/2005 |
| KR | 10-2007-0024373 A | 3/2007 |

* cited by examiner

MULTI LAYER CIRCUIT BOARD AND MANUFACTURING METHOD OF THE SAME

This is a U.S. national stage application of International Application No. PCT/KR2008/007509, filed on 18 Dec. 2008. Priority under 35 U.S.C. §119(a) and 35 U.S.C. §365(b) is claimed from Korean Application No. 10-2008-0089647, filed 11 Sep. 2008, the disclosure of which is also incorporated herein by reference.

TECHNICAL FIELD

The present invention relates to a multilayered PCB and a method for manufacturing the same. More particularly, the present invention relates to a PCB having multiple layers of heavy copper and a method for manufacturing the same.

BACKGROUND ART

As generally known in the art, PCBs conventionally employ copper rated 0.5-2.0 oz, and the thickness of copper in this case is about 18-70 µm (the thickness of copper per 1 oz is about 35 µm). For example, in the case of a PCB requiring a high current, the sectional area of copper of inner layers is preferably increased. In order to increase the sectional area of copper, the thickness of copper of the PCB must have a large value, and heavy copper (at least 4 oz) is commonly used for PCBs.

In the case of heavy copper of about 4 oz, the thickness is about 140 µm. If multilayered wiring is to be constructed on a PCB having such thick copper, the space between copper, which has a resin pattern, may left unfilled in the lamination step.

Particularly, referring to FIG. 1, which shows a conventional process for manufacturing multilayered PCBs, a prepreg 20, which is obtained by impregnating a substrate with a resin, is compressed at high temperature and pressure in a lamination process so that the space between patterns is filled. If copper 11 of the core layer has a step as thick as 140 µm, voids 30a, 30b, 30c, 30d may be formed between copper patterns.

Various methods have been proposed to solve the above-mentioned problems.

For example, Korean Laid-open Patent Publication No. 2004-0111302 proposes a method of printing stepped portions of copper by using an epoxy material. However, this method is not suited to mass production, and increases the manufacturing cost.

Furthermore, Korean Laid-open Patent Publication No. 2005-0112365 proposes technology of using RCC (Resin Coated Copper), which contains no substrate, as a buildup material in order to increase the resin content ratio of the buildup material used in the lamination process. However, this technology has a problem in that, since the buildup material contains no substrate but only a resin, it is structurally and thermally unstable (i.e. vulnerable to mechanical and thermal impact), and is expensive.

Therefore it is requested to manufacture a PCB having multiples layers of heavy copper, which is inexpensive and thermally stable, and which makes it possible to simplify the processes without creating voids during lamination.

DISCLOSURE OF INVENTION

Technical Problem

Therefore, the present invention has been made in view of the above-mentioned problems, and the present invention provides a PCB having multiple layers of heavy copper, which is inexpensive and thermally stable, and which makes it possible to simplify the processes without creating voids during lamination.

Technical Solution

In accordance with an aspect of the present invention, there is provided a multilayered PCB employing nonwoven glass web, which has a higher resin content ratio than glass fabric, as the substrate of a first prepreg laminated adjacent to heavy copper portions. The prepreg having nonwoven glass web as its substrate may be used alone or together with another prepreg having glass fabric as the substrate.

Particularly, there is provided a multilayered PCB employing a prepreg having a nonwoven glass web substrate, the PCB including a copper clad laminate having first copper patterned on one surface or both surfaces of a core substrate; at least one first prepreg laminated on one surface or both surfaces of the copper clad laminate, nonwoven glass web being used as the substrate of the first prepreg; at least one second prepreg laminated on one surface or both surfaces of the first prepreg, glass fabric being used as a substrate of the second prepreg; and second copper laminated on one surface or both surfaces of the second prepreg.

In accordance with another aspect of the present invention, there is provided a multilayered PCB employing a prepreg having a nonwoven glass web substrate, the PCB including a copper clad laminate having first copper patterned on one surface or both surfaces of a core substrate; at least one first prepreg laminated on one surface or both surfaces of the copper clad laminate, nonwoven glass web being used as the substrate of the first prepreg; and second copper laminated on one surface or both surfaces of the first prepreg.

The first copper is heavy copper having at least a predetermined thickness, e.g. a thickness of at least 140 µm.

The first prepreg preferably includes at least one prepreg having a resin content ratio of at least 70%. More preferably, at least one nonwoven glass web having a resin content ratio of about 80-95% is used.

If the resin content ratio is below about 70%, the space between copper, which has a resin pattern, may left unfilled in the lamination step, creating voids and dimples.

In accordance with another aspect of the present invention, there is provided a method for manufacturing a multilayered PCB employing a prepreg having a nonwoven glass web substrate, the method including the steps of (a) patterning first copper on one surface or both surfaces of a core to form a copper clad laminate; (b) arranging at least one first prepreg on one surface or both surfaces of the copper clad laminate, nonwoven glass web being used as the substrate of the first prepreg, and laminating second copper on one surface or both surfaces of the first prepreg; and (c) pressing the laminated first prepreg and the second copper at high temperature and pressure.

Preferably, in step (b), at least one second prepreg is additionally arranged between the first prepreg and the second copper, glass fabric being used as the substrate of the second prepreg, and, in step (c), the laminated first prepreg, the second prepreg, and the second copper are pressed and bonded.

The method may further include a step of (d) forming a circuit protection layer on an outer surface of the second copper after step (c).

Advantageous Effects

The present invention has the following advantages.

1. The first prepreg 200, 200' which is laminated adjacent to copper 120, 120' employs nonwoven glass web, which contains a higher resin content ratio than glass fabric, as the substrate. This makes it possible to efficiently fill space between heavy copper, which is comparable to a thick film, without voids.

2. The first prepreg 200, 200' according to the present invention employs nonwoven glass web, which has no orientation, as the substrate. Compared with glass fabric, which has orientation, the nonwoven glass web is better suited to fill the space between copper, which is structurally irregular.

3. Use of nonwoven glass web (which has no orientation) as the substrate of the first prepreg 200, 200' substantially reduces the problem of surface deformation (e.g. dimpling), which is caused by contraction or restoration force after lamination by heating and compressing.

4. The nonwoven glass web, which constitutes the substrate of the first prepreg 200, 200' is less expensive and undergoes less thermal deformation than a buildup material, which contains no substrate but only a resin (e.g. resin coated copper), or glass fabric.

BRIEF DESCRIPTION OF THE DRAWINGS

The foregoing and other objects, features and advantages of the present invention will become more apparent from the following detailed description when taken in conjunction with the accompanying drawings in which.

BEST MODE FOR CARRYING OUT THE INVENTION

Hereinafter, exemplary embodiments of the present invention will be described with reference to the accompanying drawings.

Mode for the Invention

Prior to describing embodiments of the present invention, the reason a prepreg having nonwoven glass web (or nonwoven glass paper) as its substrate is more suited to fill space between copper than a prepreg having glass fabric as its substrate will be described with reference to FIGS. 2 and 3, which magnify the texture of nonwoven glass web and glass fabric, respectively.

Figure 1:
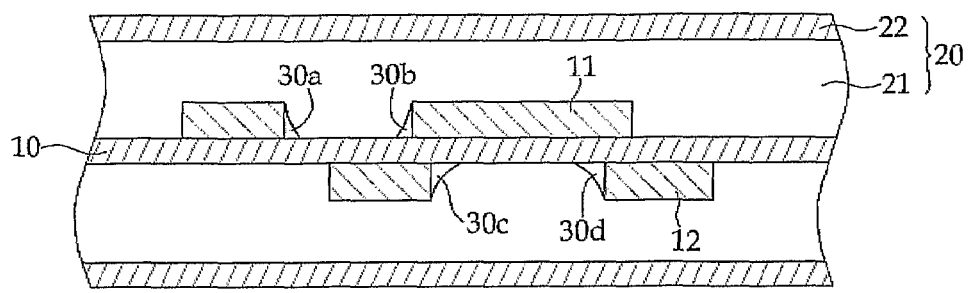
FIG. 1 shows a conventional multilayered PCB.
Figure 2:
FIGS. 2 and 3 magnify the texture of nonwoven glass web (or nonwoven glass paper) and glass fabric.
Figure 3:
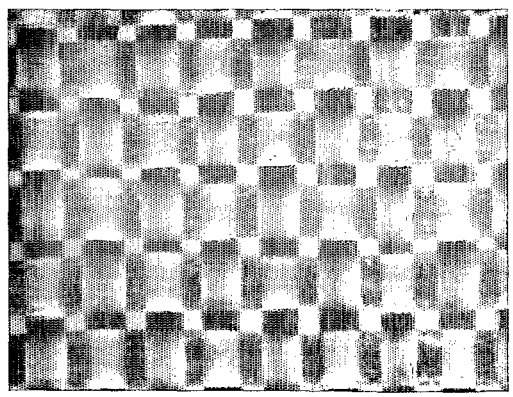

It is clear from FIG. 3 that the warp and weft of glass fabric are arranged perpendicularly, but the nonwoven glass web shown in FIG. 2 has small fragments of glass fibers mixed with the resin without orientation. The nonwoven glass web has a higher proportion of glass fiber than the resin. The ratio of glass fiber to resin is preferably 90:10, but is not limited to a specific value.

The present invention is characterized in that, as the buildup material (particularly, a material for filling space between copper), a prepreg having nonwoven glass web as its substrate is solely used. Alternatively, a mixture of a prepreg having nonwoven glass web as its substrate and another prepreg having glass fabric as its substrate is used. Advantages of nonwoven glass web over glass fabric in the buildup process are as follows.

Firstly, nonwoven glass web contains a higher proportion of resin than glass fabric, and is more suited to fill space between copper.

Secondly, nonwoven glass web has no orientation, and is more suited to fill space between copper, which is structurally irregular, than glass fabric having orientation.

Thirdly, nonwoven glass web has no orientation, and the problem of surface deformation (e.g. dimpling) caused by contraction or restoration force after lamination by heating and compressing is substantially reduced compared with glass fabric, which has orientation.

Fourthly, the cost is low.

Fifthly, less thermal deformation occurs.

Furthermore, a prepreg having nonwoven glass web as its substrate has less surface deformation, costs less, and undergoes substantially less thermal deformation than a buildup material (e.g. resin coated copper), which contains no substrate but only a resin.

Embodiments of the present invention will be described in detail. It is obvious to those skilled in the art that, although it will be assumed in the following description of embodiments that a prepreg is laminated on both surfaces of a CCL, the prepreg may be laminated only one surface of the CCL, without departing from the scope of the present invention. Furthermore, the number of prepregs laminated on the CCL is not limited to the examples given below, but can be modified variously.

Embodiment 1

Two Layers of Nonwoven Glass Web Prepreg+One Layer of Glass Fabric Prepreg

Figure 4:
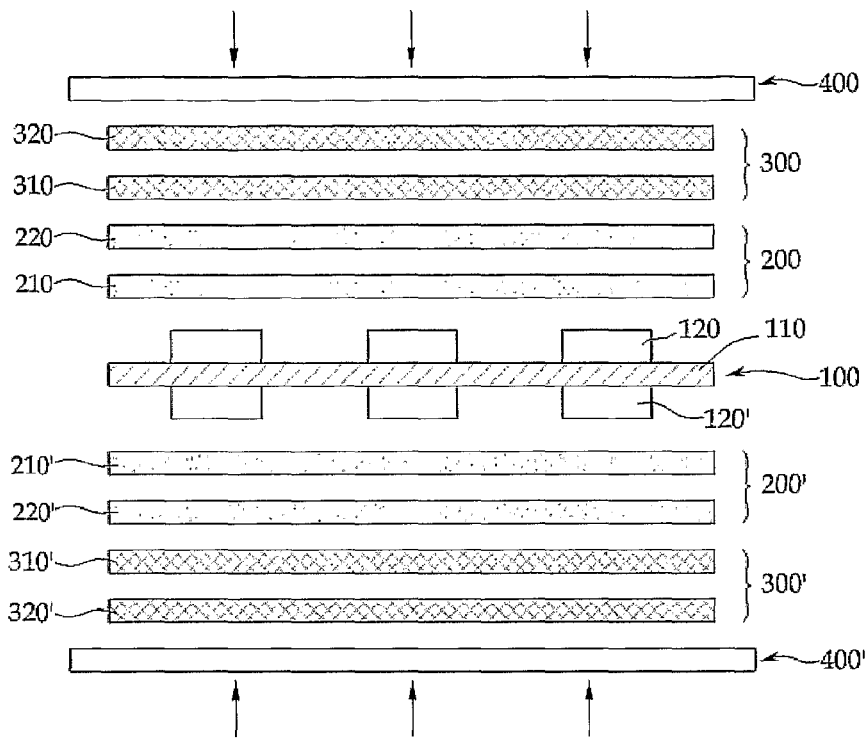
FIG. 4 shows the construction according to Embodiment 1 of the present invention.

FIG. 4 shows the construction according to Embodiment 1 of the present invention.

As shown, a multilayered PCB according to Embodiment 1 has two layers of first prepreg 200, 200' which have nonwoven glass web as the substrate, and one layer of second prepreg 300, 300' which has glass fabric as the substrate, arranged between a CCL (Copper Clad Laminate) 100 and second copper 400, 400' respectively.

The CCL 100 is fabricated by coating both surfaces of a core substrate 110 with first copper 120, 120' and forming a predetermined pattern of circuitry through an electric (optical) etching process, such a photoetching. The first copper 120, 120' inside the CCL 100 according to the present invention refers to heavy copper of at least 4 oz, and preferably has at least a predetermined thickness (e.g. at least about 140 μm). As the CCL 100, the present invention employs CCL 0.18T 12/12, which is obtained by coating both surfaces of a core substrate 110 having a thickness of 0.18 mm (180 μm) with copper 120 of 12 oz (about 420 μm).

As the first prepreg 200, 200' GlassWeb nonwoven glass web is employed, which has nonwoven glass web as its substrate and which has a thickness of about 100 μm (TW 5.0 g) or about 110 μm (TW 7.5 g). The resin content ratio of the first prepreg 200, 200 is at least 70%, more preferably 80-95%.

The second prepreg 300, 300' has glass fabric as its substrate, and the present embodiment employs GlassFabric 7628 prepreg having a resin content ratio of 45%.

As the second copper 400, 400' C/F 2 OZ is employed, which is rated 2 oz (about 70 μm).

Detailed physical properties according to Embodiment 1 are given in Table 1 below.

TABLE 1

| Construction | Product | Physical properties |
|---|---|---|
| CCL 100 | CCL 0.18T 12/12 | Core 110 thickness: 180 μm Copper 120, 120' thickness: 420 μm (12 oz) |
| First prepreg 200, 200' | GlassWeb TW 5.0 g/7.5 g (first layer) | Substrate: nonwoven glass webResin content ratio: 80-95% Thickness: 100/110 μm (5 g/7.5 g) |
| | GlassWeb TW 5.0 g/7.5 g (second layer) | Substrate: nonwoven glass webResin content ratio: 80-95% Thickness: 100/110 μm (5 g/5.7 g) |
| Second prepreg 300, 300' | GlassFabric 7628 | Substrate: glass fabricResin content ratio: 45% Thickness: 170 μm |
| Second copper 400, 400' | C/F 2 OZ | Copper thickness: 70 μm (2 oz) |

Figure 11:
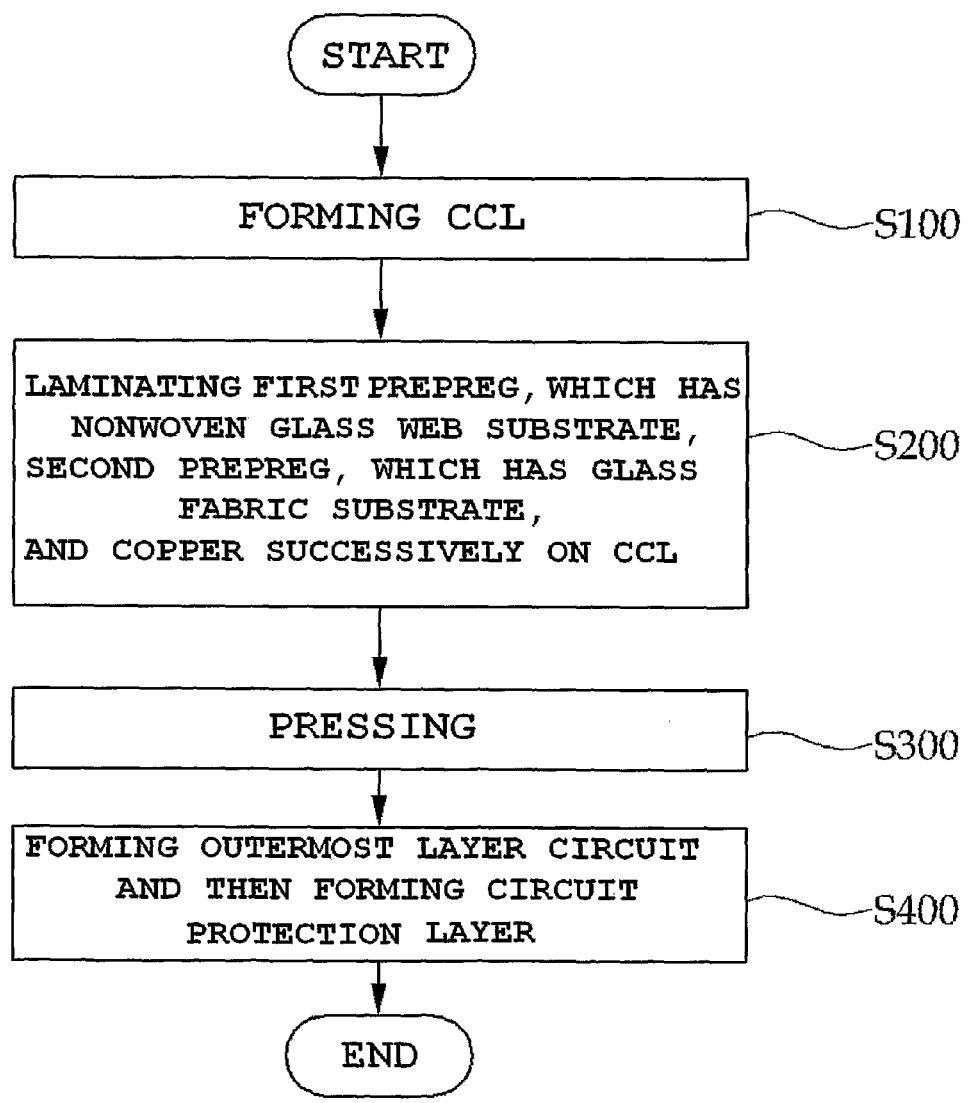
FIG. 11 is a flowchart showing processes for manufacturing a multilayered PCB according to the present invention.
Figure 12:
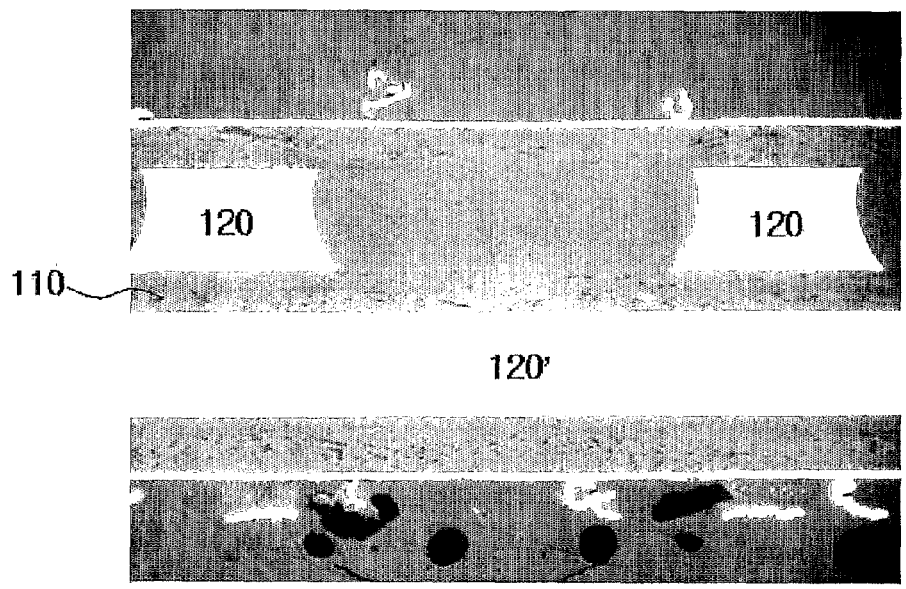
FIGS. 12-19 show embodiments of the present invention, before and after testing.
Figure 13:
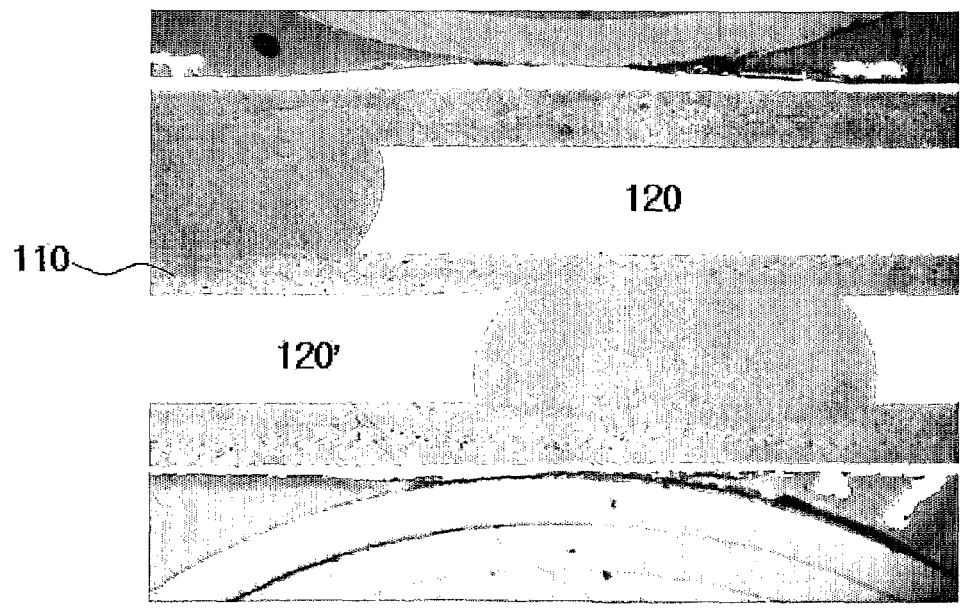
Figure 14:
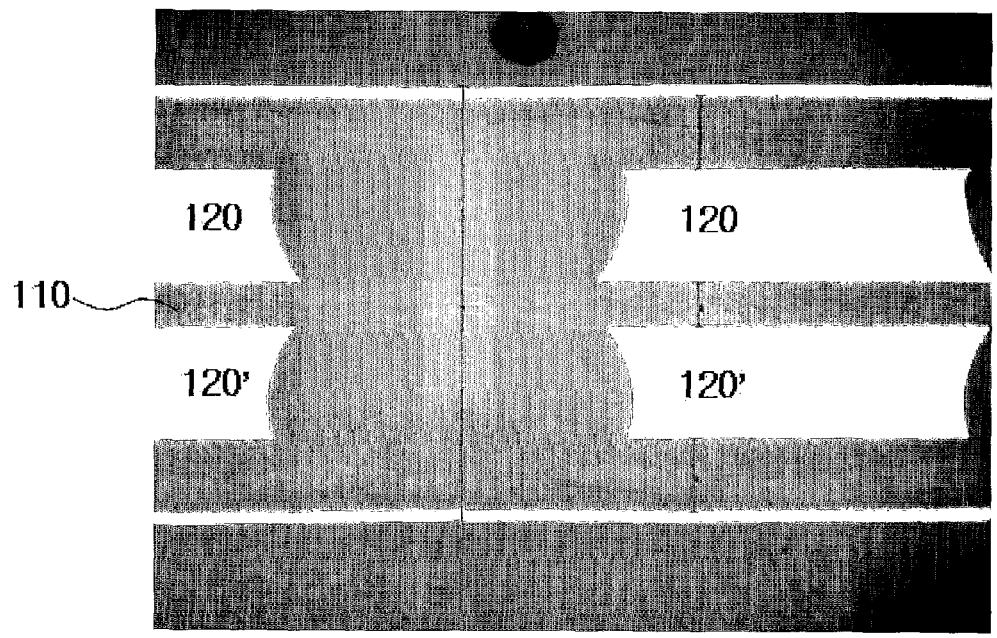
Figure 15:
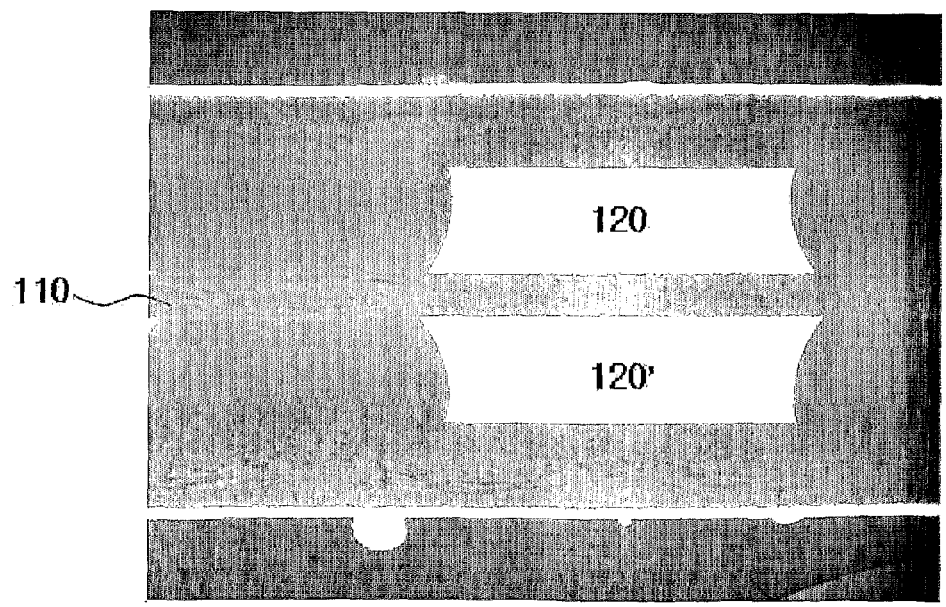
Figure 16:
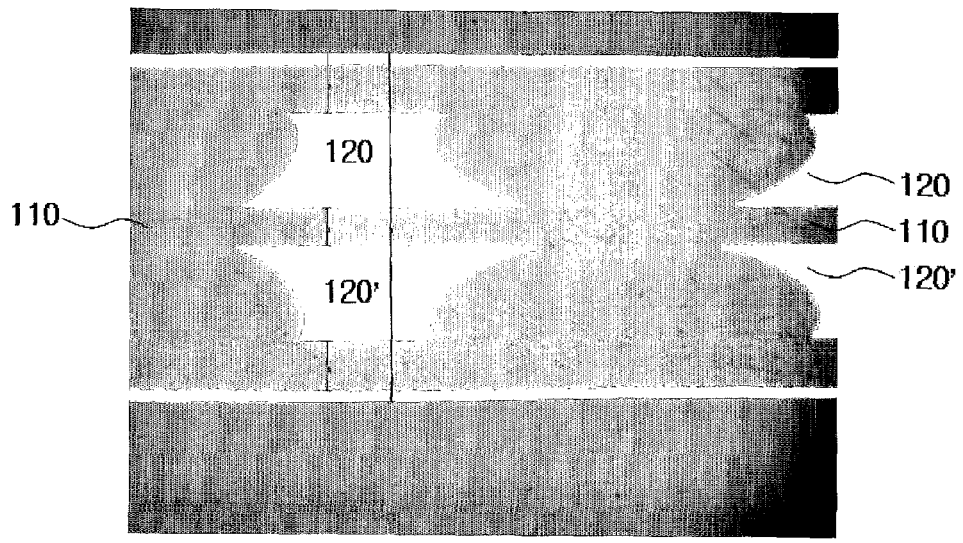
Figure 17:
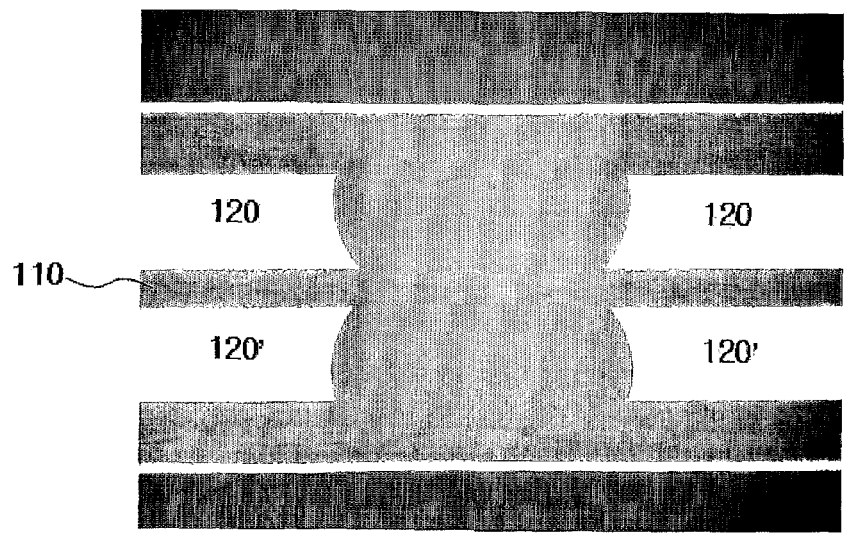
Figure 18:
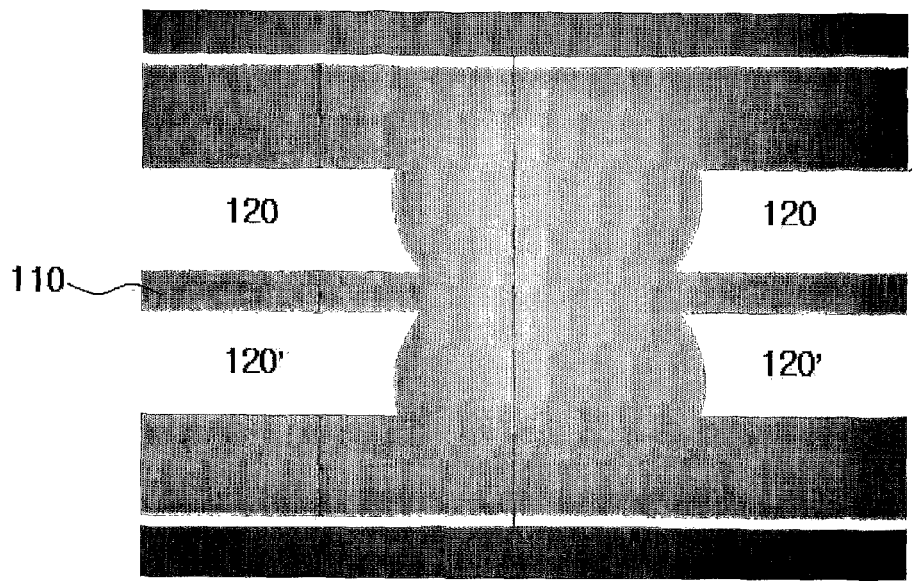
Figure 19:
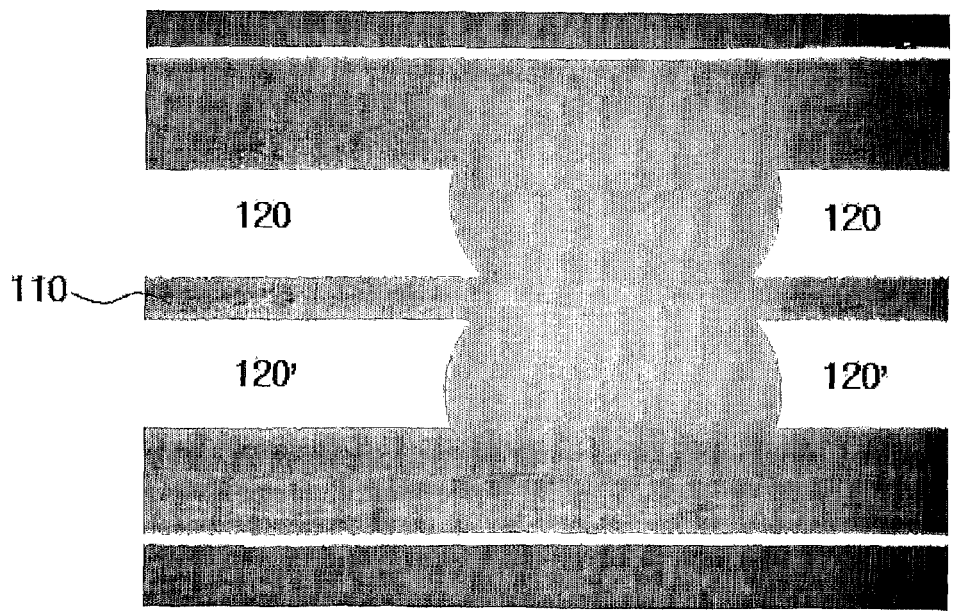

Processes for manufacturing a multilayered PCB according to Embodiment 1 will now be described with reference to FIGS. 5-8 (which show the construction) and FIG. 11 (which is a flowchart).

Figure 5:
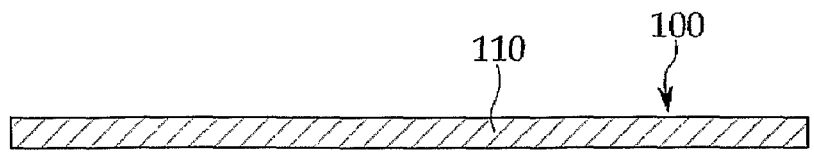
FIGS. 5-8 show manufacturing processes according to Embodiment 1 of the present invention.
Figure 6:
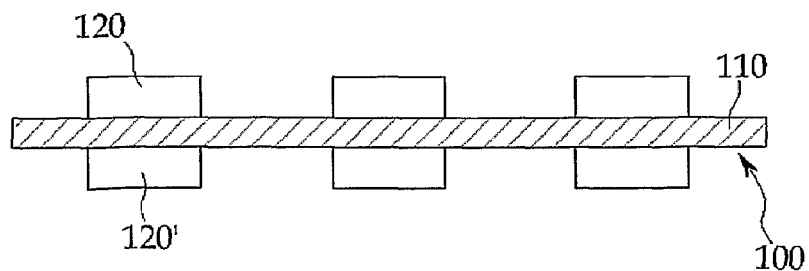

As shown in FIGS. 5 and 6, both surfaces of a core substrate 110 are coated with first copper 120, 120' and a predetermined pattern of circuitry is formed through an electric (optical) etching process, such as photoetching, to fabricate a CCL 110 (S100).

Figure 7:
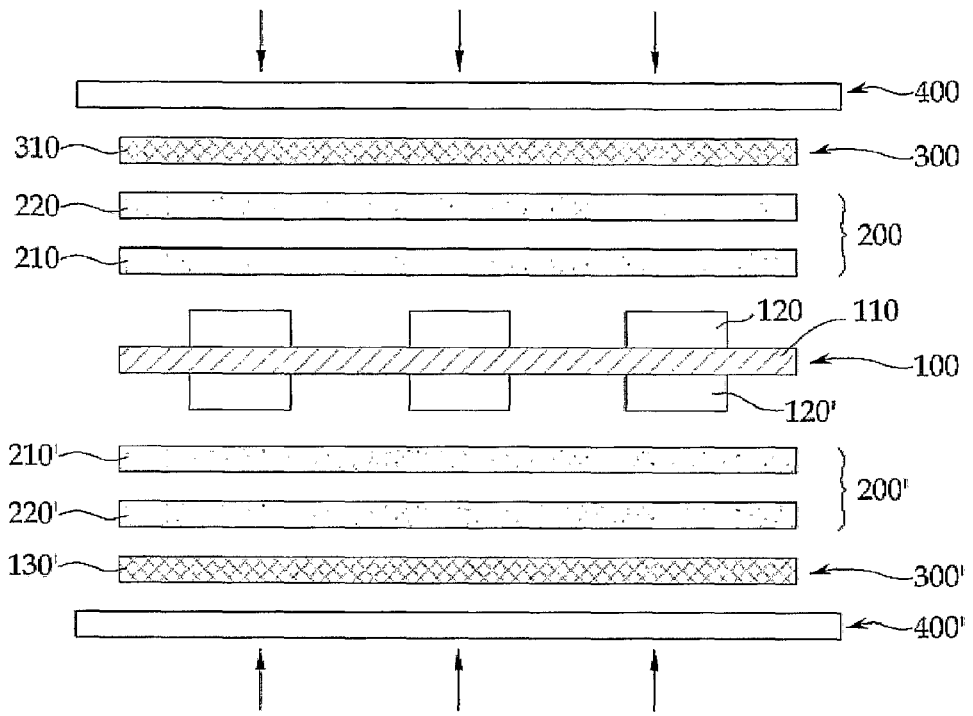

After the CCL 100 is fabricated, at least one layer of first prepreg 200, 200' which has nonwoven glass web as the substrate, at least one layer of second prepreg 300, 300' which has glass fabric as the substrate, and second copper 400, 400' are successively arranged and laminated on both surfaces of the CCL 100, respectively, as shown in FIG. 7 (S200). According to the present embodiment, the first prepreg 200, 200' includes two layers 210, 220; 210', 220' and the second prepreg 300, 300' consists of one layer.

Figure 8:
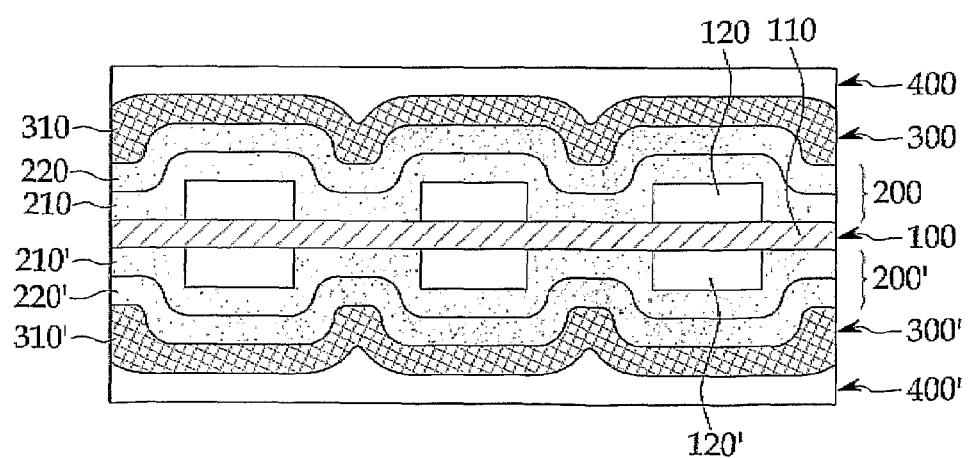

After the first prepreg 200, 200' the second prepreg 300, 300' and the second copper 400, 400' are successively laminated on both surfaces of the CCL 100, it is subjected to pressing at predetermined temperature and pressure. As a result, the first prepreg 200, 200' and the second prepreg 300, 300' are properly bent and fully inserted into space between the copper to fill the space and to bond with the CCL 100, as shown in FIG. 8 (S300). It is clear from FIG. 8 that, after the filling process is over, no void is created in the space between copper 120, 120'

After the bonding is completed, a circuit may be formed on the outermost layer together with an additional circuit protection layer (S400).

The present embodiment employs nonwoven glass web, which has a higher resin content ratio than glass fabric, as the substrate of the first prepreg 200, 200' laminated adjacent to the copper 120, 120' This makes it possible to efficiently fill space between heavy copper as thick as of 4 oz or more without creating voids.

The substrate of the first prepreg 200, 200' i.e. nonwoven glass web, has no orientation, and is more suited to fill space between copper, which is structurally irregular, than glass fabric, which has orientation.

Furthermore, the substrate of the first prepreg 200, 200' i.e. nonwoven glass fabric, has no orientation, and the problem of surface deformation (e.g. dimpling) caused by contraction or restoration force after lamination by heating and compressing is substantially reduced compared with glass fabric, which has orientation.

The substrate of the first prepreg 200, 200' i.e. nonwoven glass web, is inexpensive and undergoes little thermal deformation.

The above-mentioned advantages are also obtained over other buildup materials, which contain no substrate but only a resin (e.g. resin coated copper).

Embodiment 2

One Layer of Nonwoven Glass Web Prepreg+One Layer of Glass Fabric Prepreg

Figure 9:
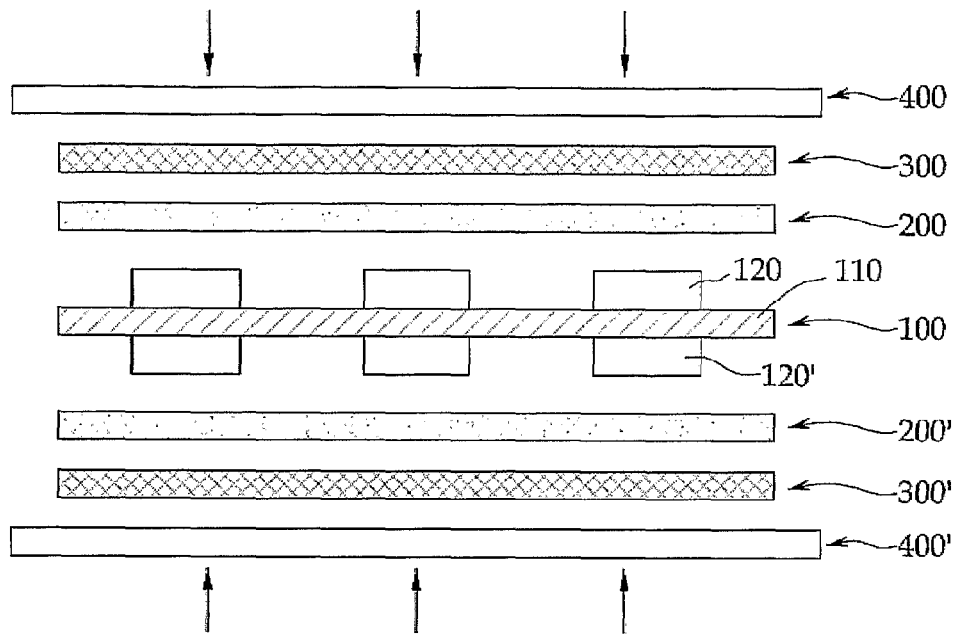
FIG. 9 shows the construction according to Embodiment 2 of the present invention.

FIG. 9 shows the construction according to Embodiment 2 of the present invention.

Unlike Embodiment 1, which employs two layers of first prepreg 200, 200' Embodiment 2 employs one layer of first prepreg 200, 200' of a different type.

Particularly, the first prepreg 200, 200' employed in Embodiment 2 is GlassWeb TW 23 g, which has nonwoven glass web as its substrate, and which has a thickness of about 170 μm (23 g). The resin content ratio of the first prepreg 200, 200' is preferably about 80-95%.

The second prepreg 300, 300 μm employed in Embodiment 2 is the same GlassFabric 7628 prepreg employed in Embodiment 1, except that the resin content ratio is about 54%.

Detailed physical properties according to Embodiment 2 are given in Table 2 below.

TABLE 2

| Construction | Product | Physical properties |
|---|---|---|
| CCL 100 | CCL 0.18T 12/12 | Core 110 thickness: 180 μm Copper 120, 120' thickness: 420 μm (12 oz) |
| First prepreg 200, 200' | GlassWeb TW 5.0 g/7.5 g (first layer) | Substrate: nonwoven glass webResin content ratio: 80-95% Thickness: 100/110 μm (5 g/7.5 g) |
| | GlassWeb TW 5.0 g/7.5 g (second layer) | Substrate: nonwoven glass webResin content ratio: 80-95% Thickness: 100/110 μm (5 g/5.7 g) |
| Second prepreg 300, 300' | GlassFabric 7628 | Substrate: glass fabricResin content ratio: 45% Thickness: 170 μm |
| Second copper 400, 400' | C/F 2 OZ | Copper thickness: 70 μm (2 oz) |

Embodiment 3

Two Layers of Nonwoven Glass Web Prepreg+Two Layers of Glass Fabric Prepreg

Figure 10:
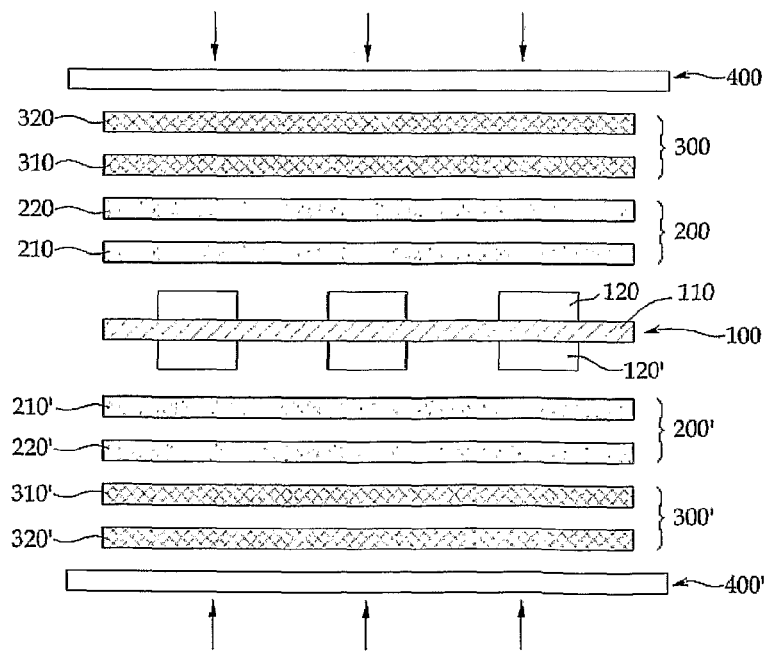
FIG. 10 shows the construction according to Embodiment 3 of the present invention.

FIG. 10 shows the construction according to Embodiment 3 of the present invention.

Unlike Embodiment 1, which employs one layer of second prepreg 300, 300' Embodiment 3 has added one layer, i.e. it has two layers of second prepreg 300, 300' The resin content ratio of the first prepreg 200, 200' is preferably about 80-95%.

Particularly, the second prepreg 300, 300' employed in Embodiment 3 includes two layers of GlassFabric 2116, which has a resin content ratio of 54%, and GlassFabric 7628, which has a resin content ratio of 48%.

Detailed physical properties according to Embodiment 3 are given in Table 3 below.

TABLE 3

| Construction | Product | Physical properties |
|---|---|---|
| CCL 100 | CCL 0.18T 12/12 | Core 110 thickness: 180 μm Copper 120, 120' thickness: 420 μm (12 oz) |
| First prepreg 200, 200' | GlassWeb TW 5.0 g/7.5 g (first layer) | Substrate: nonwoven glass webResin content ratio: 80-95% Thickness: 100/110 μm (5 g/7.5 g) |
| | GlassWeb TW 5.0 g/7.5 g (second layer) | Substrate: nonwoven glass webResin content ratio: 80-95% Thickness: 100/110 μm (5 g/5.7 g) |
| Second prepreg 300, 300' | GlassFabric 7628 | Substrate: glass fabricResin content ratio: 45% Thickness: 170 μm |
| Second copper 400, 400' | C/F 2 OZ | Copper thickness: 70 μm (2 oz) |

Comparative Example 1

Four Layers of Glass Fabric Prepreg (Containing No Layer of Nonwoven Glass Web Prepreg)

Comparative example 1 employs four layers of GlassFabric 1080 prepreg, which has glass fabric as the substrate, and which has a resin content ratio of 68%, between the CCL 100 and second copper 400, 400'.

Comparative Example 2

Five Layers of Glass Fabric Prepreg (Containing No Layer of Nonwoven Glass Web Prepreg)

Comparative example 2 employs three layers of GlassFabric 1080 prepreg, which has glass fabric as the substrate, and which has a resin content ratio of 68%, and two layers of GlassFabric 106 prepreg, which has glass fabric as the substrate and which has a resin content ratio of 73%, between the CCL 100 and second copper 400, 400'.

Effect Test: Thermal Stress Test

Thermal stress tests are conducted with regard to the above-mentioned Embodiments 1-3 and Comparative examples 1 and 2.

Test type: samples are dipped into a solder bath of 288° C. to verify heat-resisting characteristics Duration and number of tests: three cycles for ten seconds Test results are given in Table 4 below.

TABLE 4

| Construction | Product | Physical properties |
|---|---|---|
| CCL 100 | CCL 0.18T 12/12 | Core 110 thickness: 180 μm Copper 120, 120' thickness: 420 μm (12 oz) |
| First prepreg 200, 200' | GlassWeb TW 5.0 g/7.5 g (first layer) | Substrate: nonwoven glass webResin content ratio: 80-95% Thickness: 100/110 μm (5 g/7.5 g) |
| | GlassWeb TW 5.0 g/7.5 g (second layer) | Substrate: nonwoven glass webResin content ratio: 80-95% Thickness: 100/110 μm (5 g/5.7 g) |
| Second prepreg 300, 300' | GlassFabric 7628 | Substrate: glass fabricResin content ratio: 45% Thickness: 170 μm |
| Second copper 400, 400' | C/F 2 OZ | Copper thickness: 70 μm (2 oz) |

It is clear from the result that no voids and delamination occurred after testing in the case of the embodiments, but voids and delamination occurred in the case of the comparative examples.

FIGS. 12-19 magnify Embodiments 1-3 before and after testing. Particularly, FIGS. 12, 14, 16, and 18 show Embodiment 1 (first prepreg: GlassWeb TW 5.0 g), Embodiment 1 (first prepreg: GlassWeb TW 7.5 g), Embodiment 2, and Embodiment 3, respectively, before testing, and FIGS. 13, 15, 17, and 19 show them after testing.

It is clear from the drawings that, in the case of Embodiments 1-3, no void has been created in the space between the first copper 120 before and after testing.

Although several exemplary embodiments of the present invention have been described for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention has the following advantages.

1. The first prepreg 200, 200' which is laminated adjacent to copper 120, 120' employs nonwoven glass web, which contains a higher resin content ratio than glass fabric, as the substrate. This makes it possible to efficiently fill space between heavy copper, which is comparable to a thick film, without voids.

2. The first prepreg 200, 200' according to the present invention employs nonwoven glass web, which has no orientation, as the substrate. Compared with glass fabric, which has orientation, the nonwoven glass web is better suited to fill the space between copper, which is structurally irregular.

3. Use of nonwoven glass web (which has no orientation) as the substrate of the first prepreg 200, 200' substantially reduces the problem of surface deformation (e.g. dimpling), which is caused by contraction or restoration force after lamination by heating and compressing.

4. The nonwoven glass web, which constitutes the substrate of the first prepreg 200, 200' is less expensive and undergoes less thermal deformation than a buildup material, which contains no substrate but only a resin (e.g. resin coated copper), or glass fabric.

The invention claimed is:

1. A multilayered PCB comprising:
   a copper clad laminate having a core substrate and first copper patterned on a surface of the core substrate;
   at least one first prepreg laminated on the copper clad laminate, nonwoven glass web being used as a substrate of the first prepreg;
   at least one second prepreg laminated on the first prepreg, glass fabric being used as a substrate of the second prepreg; and
   second copper laminated on the second prepreg,
   wherein the first prepreg has no orientation and the second prepreg has orientation, and the first prepreg has a resin content ratio higher than that of the second prepreg.

2. The multilayered PCB as claimed in claim 1, wherein the first copper is heavy copper having a thickness of at least 140 μm.

3. The multilayered PCB as claimed in claim 1, wherein the first prepreg has a resin content ratio of at least 70%.

4. The multilayered PCB as claimed in claim 1, wherein the first prepreg has a resin content ratio of 80-95%.

5. The multilayered PCB as claimed in claim 1, wherein the second prepreg has a resin content ratio of 45-54%.

* * * * *